United States Patent [19]
Kusumoto

[11] Patent Number: 6,093,935
[45] Date of Patent: *Jul. 25, 2000

[54] TRANSISTOR AND METHOD FOR MANUFACTURING THE SAME

[75] Inventor: Naoto Kusumoto, Kanagawa-ken, Japan

[73] Assignee: Semiconductor Energy Laboratory Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/707,490

[22] Filed: Sep. 19, 1996

Related U.S. Application Data

[62] Division of application No. 08/606,684, Feb. 26, 1996, Pat. No. 5,581,102, and a continuation of application No. 08/191,485, Feb. 4, 1994, abandoned.

[30] Foreign Application Priority Data

Feb. 5, 1993 [JP] Japan ................................. 5-41832

[51] Int. Cl.⁷ ............................. H01L 29/76; H01L 29/22
[52] U.S. Cl. ............................. 257/52; 257/66; 257/347; 257/618
[58] Field of Search ....................... 257/66, 347, 67, 257/77, 78, 74, 70, 349, 352, 57, 58, 50, 466, 618, 623, 616

[56] References Cited

U.S. PATENT DOCUMENTS

| | | |
|---|---|---|
| 4,095,251 | 6/1978 | Dennard et al. |
| 4,683,645 | 8/1987 | Naguib et al. ............... 437/41 |
| 4,737,471 | 4/1988 | Shirato et al. ............... 437/44 |
| 4,956,691 | 9/1990 | Culley et al. ............... 257/369 |
| 4,997,777 | 3/1991 | Boivin ............... 438/38 |
| 5,041,885 | 8/1991 | Gualandris et al. ............... 257/138 |
| 5,124,272 | 6/1992 | Saito et al. ............... 257/282 |
| 5,308,998 | 5/1994 | Yamazaki et al. ............... 257/57 |
| 5,523,605 | 6/1996 | Yamazaki et al. ............... 257/369 |
| 5,726,487 | 3/1998 | Sameshima et al. ............... 257/616 |
| 5,780,345 | 7/1998 | Yamazaki et al. ............... 438/282 |

FOREIGN PATENT DOCUMENTS

| | | | |
|---|---|---|---|
| 513590-A2 | 11/1992 | European Pat. Off. | ............... 257/347 |
| 63-200572 | 8/1988 | Japan | ............... 257/369 |
| 1-64262 | 3/1989 | Japan | ............... 257/369 |
| 1-96961 | 4/1989 | Japan | ............... 257/347 |
| 2-35779 | 2/1990 | Japan | ............... 257/369 |
| 2-228071 | 9/1990 | Japan | ............... 257/369 |
| 3-165575 | 7/1991 | Japan | ............... 257/66 |
| 4-196490 | 7/1992 | Japan | ............... 257/57 |
| 91-20934 | 12/1991 | Rep. of Korea | ............... 257/369 |

OTHER PUBLICATIONS

"Device Electronics for Integrated Circuits" Second Edition, Richard S. Muller, John Wiley & Sons, 1986, pp. 454–456.

*Primary Examiner*—Donald L. Monin, Jr.
*Attorney, Agent, or Firm*—Sixbey, Friedman, Leedom & Ferguson, PC; Gerald J. Ferguson, Jr.; Eric J. Robinson

[57] ABSTRACT

In a process for manufacturing a thin film transistor having a semiconductor layer constituting source and drain regions and a channel forming region, by the semiconductor layer being made thinner in the source and drain regions than in the channel forming region a structure is realized wherein, at the boundary between the source region and the channel forming region and the boundary between the drain region and the channel forming region, portions where electric field concentrations occur are displaced from the portion where a channel is formed. By reducing the OFF current (the leak current) without also reducing the ON current, a high mutual conductance is realized.

24 Claims, 4 Drawing Sheets

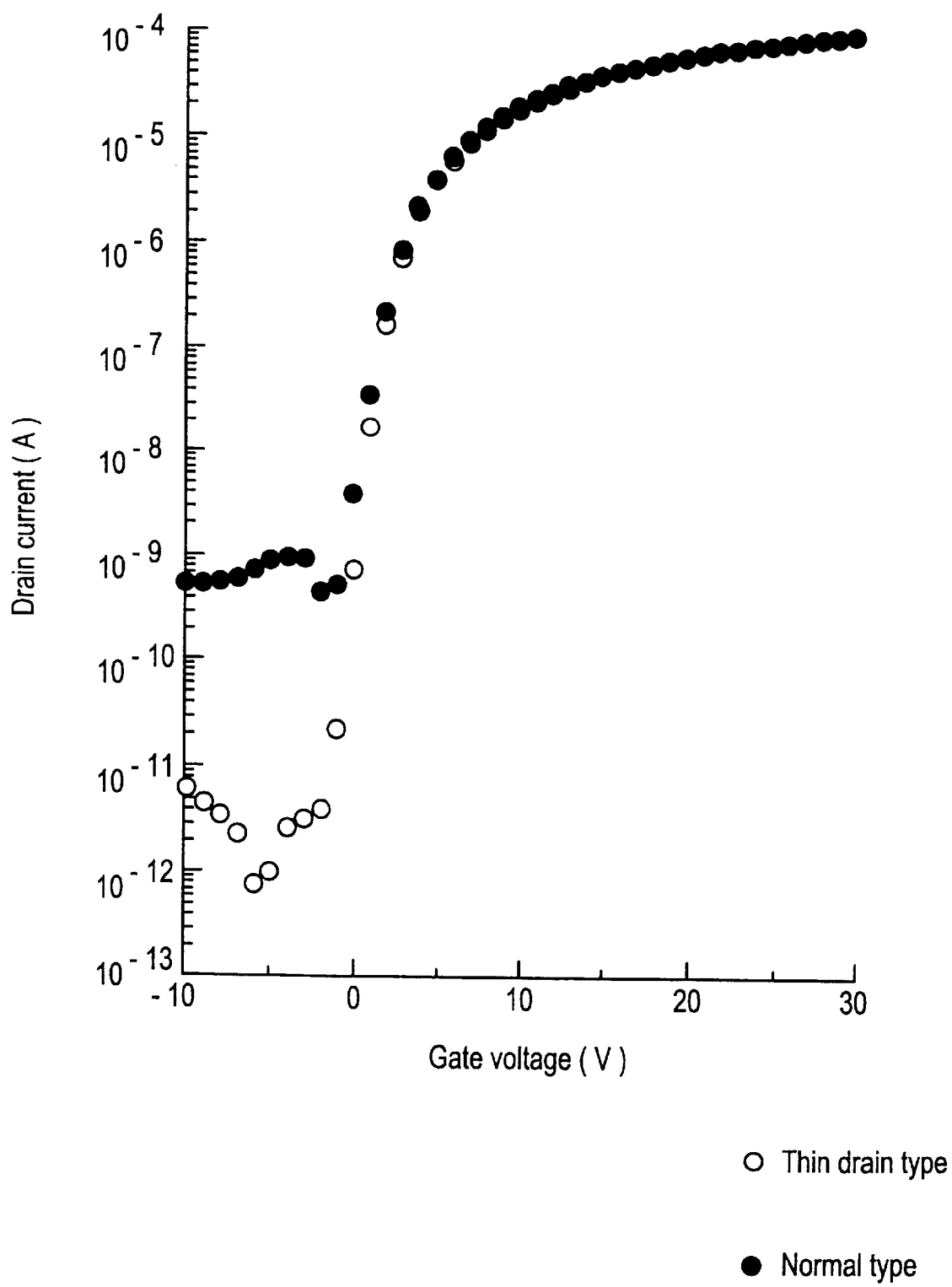

TRANSISTOR AND METHOD FOR MANUFACTURING THE SAME

This is a Divisional application of Ser. No. 08/606,684, filed Feb. 26, 1996; now U.S. Pat. No. 5,581,102 which itself is a continuation of Ser. No. 08/191,485, filed Feb. 4, 1994, now abandoned.

BACKGROUND OF THE INVENTION

1. Field of the Invention

This invention relates to a thin film transistor (hereinafter referred to as TFT) and a method of manufacturing the same, and in particular to a technique for obtaining a TFT having a high withstand voltage and a low leak current characteristic by a simple manufacturing process.

2. Prior Art

Thin film transistors, which are active elements having semiconductor thin film layers formed on an insulating substrate, various applications including transmission-type liquid crystal displays of large surface area and contact-type image sensors are being aimed at. Particular attention is being centered on devices based on polycrystalline silicon. As an active element, the requirements to be met by a TFT include:

A. a high mutual conductance, and

B. a high dielectric withstand voltage between the source and the drain.

The mutual conductance referred to here is a concept which corresponds to the amplification factor of a transistor or a vacuum tube, and is defined, for $V_{DS}$=constant, as $(dI_D/dV_{GS})$, where $I_D$ is the drain current, $V_{GS}$ is the gate control voltage, and $V_{DS}$ is the source-drain voltage.

The reason why a high dielectric withstand voltage is required between the source and the drain of an active TFT is that no leak current should flow between the source and the drain as a result of a voltage applied across the two. More specifically, the TFT must have a voltage withstand characteristic, with respect to a voltage applied between the source and the drain, such that no leak current (called OFF current) is allowed to flow between the source and the drain when the TFT is in the OFF state, i.e. the state in which no electric current should be allowed to flow between the source and the drain, and in order to achieve this it is necessary for the source-drain dielectric withstand voltage to be made high.

To satisfy the above-mentioned requirements, various ideas, including an LDD (Light Dope Drain) structure and a gate offset structure have been proposed. However, the present situation is that it is not possible with a simple self alignment process to realize completely a structure which satisfies the above requirements A and B.

FIG. 1(E) of the accompanying drawings schematically illustrates the construction of a known TFT that has been proposed to realize a high withstand voltage and a low leak current characteristic. This TFT is of a so-called gate offset structure, and, as shown in FIG. 1(E), comprises a source region 17, a channel forming region 18 and a drain region 19 along with a pair of gate offset regions 20 respectively disposed between the source region 17 and the channel forming region 18 and between the channel forming region 18 and the drain region 19; these offset gate regions 20 alleviate any electric field concentrations occurring at and near the boundaries of the regions 17, 18 and 19 (and particularly at and near the boundary separating the drain region and the channel forming region) and in this way the structure aims to realize a high withstand voltage and a low leak current characteristic.

Although the term "a channel forming region" is defined for the purpose of the present invention as a region of a TFT where a channel is formed, it does not necessarily mean that the entire region becomes a channel. In general, it is thought that a channel is formed to a thickness of several hundred Amstrongs at and near the surface that faces the gate electrode through the gate insulator film (in FIG. 1, the interface of the channel forming region 18 and the gate insulation film 14).

Although like the channel forming region the offset gate regions 20 do not positively possess any single conductivity type, because they are not directly affected by the electric field of the gate electrode 15 of the device they each operate as a kind of buffer region which functions neither as a channel nor as a source/drain region. Although not described in detail here, in an LDD structure (Light Dope Drain structure) a high withstand voltage and a low leak characteristic are realized by causing a region between the channel forming region and the drain region which has been lightly doped with an impurity that imparts a conductivity type to function as a buffer so that any electric field concentration occurring at or near the boundary of the channel forming region and the drain region of the device is alleviated.

The structure of the gate offset type TFT mentioned above will now be described, with reference to FIG. 1. The TFT shown in FIG. 1(E) comprises a glass substrate 11, a silicon oxide base film 12, a source region 17, a channel forming region 18, a drain region 19, a silicon oxide film 14 which is a gate insulation film, a gate electrode 15, an interlayer insulation film 16, a source electrode 21, a drain electrode 23 and offset gate regions 20.

With a TFT having the configuration illustrated in FIG. 1(E), the provision of the offset gate regions 20 to alleviate any concentrations occurring in the electric fields at and near the boundaries of the regions 17, 18 and 19 (and particularly near the boundary of the channel forming region 18 and the drain region 19) when the source and the drain of the device are subjected to an electric field can realize a significant reduction in the leak current.

However, while the offset gate regions 20 can sufficiently contribute to improvement of the withstand voltage between the source and the drain, they themselves have a high resistance because they are made of a non-doped semiconductor. Thus, with the configuration illustrated in FIG. 1(E). the offset gate regions 20 operate as parasitic resistors connected in series to the channel forming region 18 and significantly lower the ON current (the drain current that runs between the source and the drain when the TFT is ON).

In other words, with the structure shown in FIG. 1(E), there is the dilemma that although it is possible to realize reductions in the leak current, the ON current falls. As a result, problems such as reduced ON/OFF ratio and reduced field effect mobility, which accompany reductions in the mutual conductance, newly arise, and it is not possible to obtain an entirely satisfactory TFT.

When on the other hand an LDD structure is adopted, although the field effect mobility is reduced to a lesser extent compared with the case of the gate offset structure, because the alleviation of the electric field concentration at the drain region end is not satisfactory, the leak current does not decrease sufficiently, and consequently, as in the case of the gate offset structure, it has not been possible to achieve a satisfactory performance improvement.

FIGS. 1(A) through (E) illustrate different steps in the manufacture of a TFT having a conventional offset gate structure. In this example, vapor phase methods are used for all the film-forming. Items (A) through (E) in the following description roughly correspond to the steps illustrated in FIGS. 1(A) through (E).

(A) A silicon oxide base film 12 is formed on a glass substrate 11 and then a non-crystalline silicon film is formed thereon. Then this non-crystalline silicon film is turned into a polycrystalline silicon film (hereinafter denoted by reference numeral 13) by either thermal solid phase growth or laser annealing.

(B) The polycrystalline silicon layer 13 is processed by photolithography and dry etching into an island shape so that an active layer island is formed. A silicon oxide film 14 is then formed thereon to serve as a gate insulation film.

(C) An impurity-doped non-crystalline silicon film is formed on the silicon oxide film 14 and then by activation by heat and excimer laser it is crystallized and its resistance is reduced. It is then processed by photolithography and dry etching to become a gate electrode 15.

(D) On top of this, a silicon oxide film 16 for forming offset regions is formed.

(E) The silicon oxide film 16 for forming offset regions is etched down to the interface with the gate electrode 15 by anisotropic etching to produce a silicon oxide film wall on the sides of the gate electrode 15 (the side surfaces of the gate electrode 15), and a source region 17 and a drain region 19 are then formed in a self aligning manner by through doping using high output ion doping.

In this process, since there is a wall of doping stopper (consisting of the silicon oxide film 16 on the side surfaces of the gate electrode 15) at the sides of the gate electrode 15, the areas below the wall are not doped and consequently highly resistive gate offset regions 20, not subject to the gate electric field, are formed respectively between the channel forming region 18 and the source region 17 and between the channel forming region 18 and the drain region 19.

However, in step (E) of the above process, when the silicon oxide film 16 is etched, because non-uniformity of the etching surface becomes a problem, the thickness of the silicon oxide film 16 on the side surface of the gate 15, which determines the offset distance, is not constant over the substrate surface, and when a number of TFTs are made on the surface of the same substrate it is difficult for a uniform offset distance to be obtained over the surface of the substrate.

Also, it is necessary for the lower crystalline silicon layer 13 to be through doped by way of the silicon oxide film 14 with ions of an element selected to impart a single conductivity type, and because compared to a case where the semiconductor layer is doped directly it is necessary to use a higher accelerating voltage, the doping efficiency is reduced, marked damage such as loss of crystallinity is suffered by the crystalline silicon layer 13, and reduced reliability is likely to result.

As described above, although a conventional gate offset structure TFT has the merits that it is possible to improve the withstand voltage between the source and the drain and reduce the leak current (the OFF current), there are the problems of reduced ON current, lowered mutual conductance and reduced field effect mobility, and also, in the process of manufacturing such a device, compared with the manufacture of a self alignment type TFT, there are an increased number of process steps and greater variation in quality and poorer yield; these devices have therefore not always been ideal.

It is therefore an object of this invention to provide a TFT having the following features which it has not been possible to obtain with conventional gate offset structure type and LDD structure type TFTs:

(a) reduced leak current (OFF current), without reduced ON current, and (b) a simple manufacturing process, with no reduction in yield, and a method for manufacturing such a TFT.

SUMMARY OF THE INVENTION

According to a first aspect of the invention, a thin film transistor having a semiconductor layer disposed on an insulating substrate, the semiconductor layer constituting a source region, a drain region and a channel forming region, is characterized in that the thickness of the semiconductor layer in the source and drain regions is lower than the thickness of the semiconductor layer in the channel forming region.

By adopting this construction it is possible for similar benefits to those obtained when the gate offset structure described above is employed to be had by making the portion constituting the film thickness differential between the channel forming region and the source/drain regions serve as a region which alleviates electrical field concentrations.

Also, because the regulating resistance of the gate offset regions themselves, which becomes a problem when the gate offset structure is adopted, is almost negligible, there is the merit that any reduction in the ON current can be made extremely small.

According to a second aspect of the invention, there is provided a method for manufacturing a thin film transistor for realizing the first aspect of the invention wherein by the steps of forming a semiconductor layer constituting a source region, a drain region and a channel forming region on an insulator substrate, forming an insulation layer constituting a gate insulation film on said semiconductor layer, forming a layer to serve as a gate electrode on said insulation layer, forming a mask for making a gate electrode on said layer to serve as a gate electrode, by anisotropic etching in the vertical direction with respect to the substrate, and using said mask, etching said layer to serve as a gate electrode and said insulation layer and then etching said semiconductor layer to a predetermined height, and using the remaining regions which were not etched by said etching as a mask, forming a source region and a drain region by doping with an impurity which imparts a single conductivity type, a structure in which the thickness of said semiconductor layer constituting said source region and said drain region is less than the thickness of said semiconductor layer constituting said channel forming region under said gate electrode is obtained.

By adopting this structure, in the semiconductor layer which forms the source region and the channel region and the drain region, a thin layer region which corresponds to the difference between the thickness of the source and drain regions and the thickness of the channel forming region is formed between the channel portion (the portion which actually becomes a channel) of the channel forming region and the source and drain regions, and the provision of this thin film layer region enables the realization of a high withstand voltage between the source and the drain.

It is a feature of the structure of this invention that a TFT can be formed in a self aligned manner. Although a method of manufacturing a TFT according to the invention involves the step of selectively etching a semiconductor layer which forms a source region, a channel forming region and a drain region to a predetermined height vertically and in a controlled manner, a step that might be thought to be troublesome, because the controllability of vertical etching rates is good this process does not present any serious problems. The reactive ion etching method is normally used for this vertical etching, but other anisotropic etching techniques may alternatively be used.

Because exposed source and drain regions can be directly doped with the impurity, the problem of damage done to the device in the process of doping with an impurity to impart a single conductivity type can be minimized. In particular, the above method is extremely advantageous in manufacturing process terms in that when a laser doping technique which uses laser light is used in an atmosphere containing the impurity element that is to be doped, the step of activating the semiconductor layer by thermal annealing after doping the semiconductor layer, which is a step that tends to cause problems, becomes unnecessary. However, a conventionally commonly used ion doping technique may be used if a certain amount of damage can be allowed. When this is done, because ions are directly implanted into the semiconductor layer, the implantation energy level can be made low and the damage caused by ion energy can be minimized.

A method of manufacturing a TFT according to the invention is also extremely advantageous in manufacturing process terms because, by the above-mentioned etching process and the process wherein an impurity which imparts a single conductivity type is doped into the semiconductor film, a thin film layer region which prevents electrical field concentrations from occurring in the source and drain regions and at the ends of the channel which forms in the upper part of the channel forming region can be formed in a self aligning manner.

In a structure according to the present invention, because a thin film layer region exists between the channel, which is the path of the electric current, and the drain region, which is the port through which carriers are led out, the electric field between the drain region and the channel forming region (called the drain electric field) is concentrated below the channel, and no phenomenon of the drain electric field contributing to channel formation occurs. Consequently, low leak current and high withstand voltage characteristics are obtained, and performance improvement effects equal to or better than those of a TFT of gate offset structure can be obtained.

Furthermore, since the portion below the channel is made to function as a buffer region for alleviating electric field concentrations, the resistance of that portion can almost be ignored, and reduction in the ON current can be suppressed. Consequently, while reducing the leak current, reduction in the ON current can be prevented. That is, the mutual conductance can be improved.

BRIEF DESCRIPTION OF THE DRAWINGS

FIG. 3 illustrates for comparison the characteristics of a conventional TFT and a TFT manufactured according to a preferred embodiment of the present invention.

DETAILED DESCRIPTION OF THE PREFERRED EMBODIMENTS

EMBODIMENT 1

In a preferred embodiment of the invention, a manufacturing method in which a structure according to the present invention is used to construct an N channel type insulated gate field effect transistor (hereinafter referred to as an NTFT) on a glass substrate, and the characteristics of such a device, will be described.

Although only a single NTFT (N channel type TFT) is formed in this preferred embodiment, a number of NTFTs can of course be made simultaneously by the same manufacturing method. Alternatively, a P channel insulated gate field effect transistor (PTFT) only can be constructed, or by the combination of N channels and P channels a TFT circuit of CMOS structure can be constructed.

The manufacturing process of this preferred embodiment will be described with reference to FIG. 2.

Figure 1A:
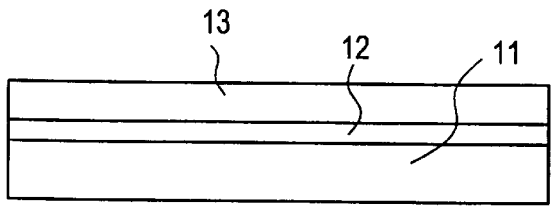
FIGS. 1(A) to 1(E) illustrate the manufacturing process of a conventional gate offset type TFT.
Figure 1B:
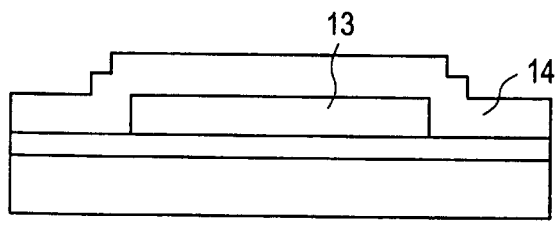
Figure 1C:
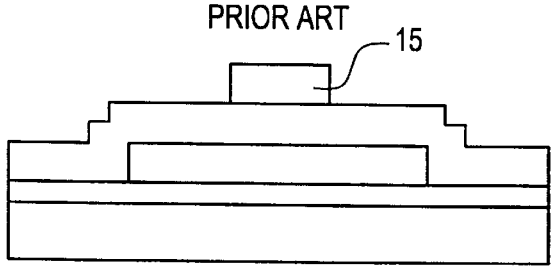
Figure 1D:
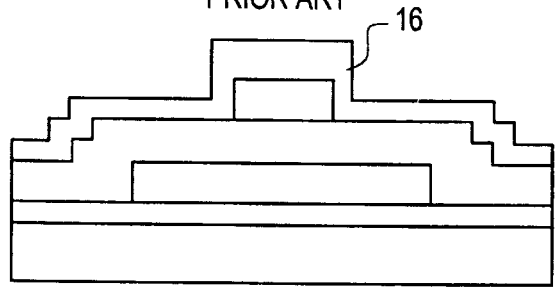
Figure 1E:
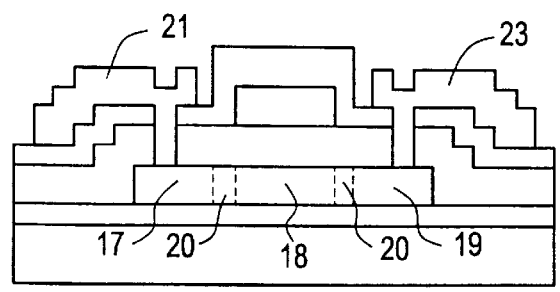
Figure 2A:
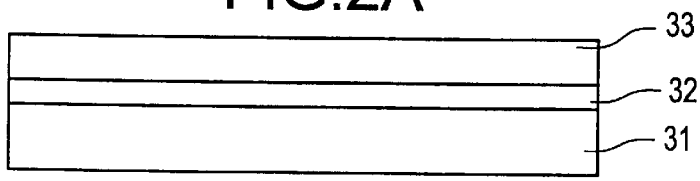
FIGS. 2(A) to 2(E) illustrate the manufacturing process of a TFT according to a preferred embodiment of the present invention.

Firstly, in FIG. 2(A), a silicon oxide film 32 was formed as a base protection film by sputtering on a glass substrate 31 to a thickness of 300 nm in a 100% oxygen atmosphere. Of course, a transparent insulating substrate other than a glass substrate may alternatively be used for the substrate. Also, silicon nitride film may be used in place of silicon oxide film for the base protection film.

Magnetron type RF sputtering was used, and film-forming was carried out in a 100% oxygen atmosphere with an RF output of 500 W against a 6-inch synthetic quartz target and at a substrate temperature of 200 degrees centigrade and a film-forming pressure of 0.6 Pa.

Next, an amorphous silicon (a-Si:H) film 33 was formed to a thickness of 100 to 200 nm on the silicon oxide film 32 to serve as a semiconductor layer to constitute the source region, the drain region and the channel forming region of the NTFT.

Although sputtering was used as the film-forming method, other known amorphous silicon film manufacturing methods such as plasma CVD, optical CVD or thermal CVD can be used.

In this preferred embodiment the manufacture by sputtering of the silicon oxide film 32 was carried out at a pressure of 0.5 Pa and with a substrate temperature of 350 degrees centigrade: in an atmosphere consisting of a mixture of argon, which is the sputtering gas, and hydrogen, high frequency electric power of frequency 13.56 MHz was applied to a highly pure and highly resistive 6-inch silicon target (cathode) and a hydrogenated amorphous silicon film was formed by a sputtering reaction.

The sputtering apparatus used for the film-forming was of multiple chamber construction, having a conveying chamber and a film-forming chamber to each of which a turbo-molecular pump and a rotary pump were connected in series; the construction is such that oxygen and other active elements present in air, which have an adverse affect on the characteristics of semiconductors, are discharged and their mixture with the film during film formation is suppressed as much as possible.

After film-forming of the hydrogenated amorphous silicon film 33, heat treatment in an inert gas atmosphere at 400 to 500 degrees centigrade for 1 to 3 hours was performed in order to purge the hydrogen contained in the film. The purpose of this heat treatment is to prevent the film surface becoming irregular as a result of a large quantity of hydrogen in the film being rapidly discharged in a short space of time during the following step of crystallization by laser light, and as much hydrogen as possible should be purged by this heat treatment. However, when the film is heat treated at a high temperature for a long period of time, crystal cores are produced by solid phase growth and polycrystallization occurs, and, because the laser light absorption coefficient (generally an excimer laser having a wavelength in the ultraviolet region is used) of polycrystalline silicon is smaller than that of amorphous silicon, good crystal formation by laser light irradiation becomes impossible. Therefore, this heat treatment should be carried out either for a short period of time at a high temperature or for a long period of time at a low temperature.

Solid phase growth induced by heat may be used for the crystallization, or a method wherein polycrystalline silicon is formed directly on the substrate by thermal CVD or the like may be used. Alternatively, it is possible to use hydrogenated amorphous silicon directly. Needless to say, a type of semiconductor which is suited to the intended application of the device should be used.

Figure 2B:
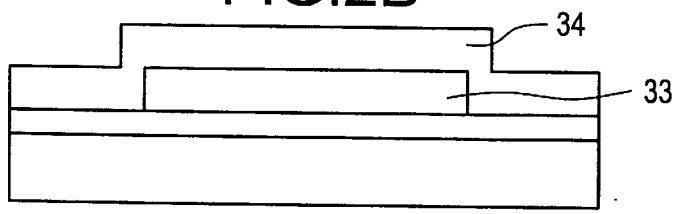

Referring to FIG. 2(B), the amorphous silicon thin film 33 on which hydrogen purging has been carried out was subjected to a photolithographic operation using a photoresist and a first chromium mask and was thereby shaped into a pattern (an island pattern) the same as the pattern of the first chromium pattern.

In order to produce the island pattern, etching of the amorphous silicon by the balanced plate reactive ion etching method (hereinafter referred to as RIE), which is an anisotropic dry etching method, was performed.

This etching by the RIE method is a well known etching technique that is widely used in the manufacture of LSIs; normally, electrodes are arranged in parallel in a vacuum vessel, a gas is introduced, and perpendicular anisotropic etching is carried out by applying high-frequency electric power to one of the electrodes so that a plasma is generated between the electrodes and ions of the plasma perpendicularly strike a substrate mounted on the electrodes. It is noted that wet etching using an etching solution containing hydrofluoric acid or nitric acid as the principal constituent may alternatively be used in this step.

In this preferred embodiment, etching by the RIE method was conducted as follows: After first placing the substrate on the electrodes, the vessel was evacuated to a high vacuum by means of a diffusion pump, carbon tetrafluoride ($CF_4$), which is an etching gas, was introduced into the vessel, the pressure was held at 10 Pa, and etching was carried out by applying high frequency electric power of frequency 13.56 MHz to an electrode at an output of 100 W. Although in this preferred embodiment carbon tetrafluoride was used, etching can be similarly performed using sulfurhexafluoride, nitrogen trifluoride or a mixture of these.

After forming the island of semiconductor layer by etching, the resist constituent was removed with a removing agent and also the natural oxide film that had formed there was removed with a 1% (vol.) fluoric acid solution.

Next, a silicon oxide film 34 to serve as a gate insulation film was formed to a thickness of 100 to 150 nm by sputtering.

Figure 2C:
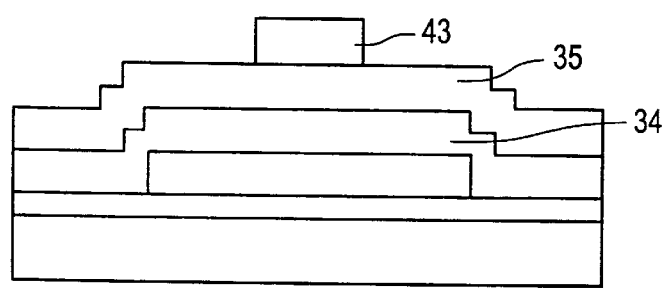

The film forming process was as follows: The substrate was placed in position in the chamber of a sputtering apparatus and the inside of the chamber was evacuated to a high vacuum by means of a turbo-molecular pump; oxygen only was introduced into the chamber as a sputtering gas, the pressure was brought to 0.6 Pa, the substrate temperature was brought to 200 degrees centigrade, a high frequency electrical power of frequency 13.56 MHz, power 500 W was applied to a 6-inch synthetic quartz target, and the silicon oxide film 34 was formed by a sputtering reaction. Although in this preferred embodiment the silicon oxide film was formed by sputtering, other methods such as plasma CVD, thermal CVD, optical CVD, liquid layer deposition or thermal oxidation may of course be used, and a silicon nitride film can be used instead of the silicon oxide film. Referring to FIG. 2(C), an amorphous silicon film later to become a gate electrode 35 was formed by sputtering to a thickness of 100 to 150 nm on the silicon oxide film 34 that is to serve as the gate oxide film. The conditions used for this process were the same as those used for forming the amorphous silicon film 33 discussed above. Since this amorphous silicon layer is highly resistive, so that it can be used as a gate electrode it is necessary for its resistance to be reduced by laser doping, which will be described hereinafter, or alternatively its resistance can be reduced by laser light or heat treatment or the like after ion doping.

If the film is formed by sputtering in which silicon that has been doped with an impurity is used as the target, a doping process is unnecessary and resistance reduction can be achieved by a laser or heat treatment based activation process only. Naturally, an impurity-doped type amorphous silicon film can be formed by plasma CVD, thermal CVD or another common film-forming method, its resistance reduced by the treatment mentioned above, and then used as a gate electrode.

Also, a metal film of aluminum, chromium molybdenum, tantalum or the like can be formed by sputtering or vapor deposition and used as a gate electrode.

A gate region was formed by photolithography and etching of the amorphous silicon film to serve as the gate electrode 35 using a second mask (a gate-forming mask). Here, the channel, source and drain of the device assume their basic structure in a self aligning manner. The conditions used in the photolithography and the etching process using RIE were the same as those used in forming the semiconductor island shape to serve as the channel forming region.

Figure 2D:
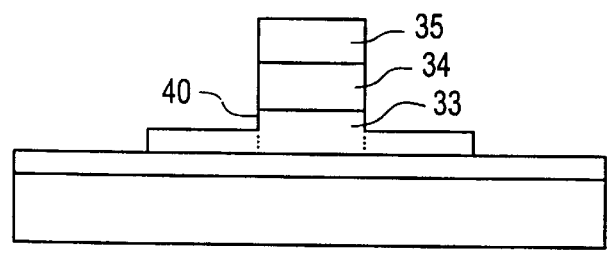

Next, RIE etching was used to obtain the shape shown in FIG. 2(D). This process is an important feature of the invention; without the etching process being stopped when just the amorphous silicon layer to serve as the gate electrode 35 has been etched, the silicon oxide film to serve as the gate insulation film 34 and the upper portions of the semiconductor layer 33 of the source and drain regions are also etched, consecutively. In this process the basic structure of the invention is formed.

In order to produce the shape shown in FIG. 2(D), it is necessary to etch parts of the upper portion of the crystallized silicon semiconductor layer 33; however, this can be done easily by experimentally obtaining suitable conditions for the process.

Figure 2E:
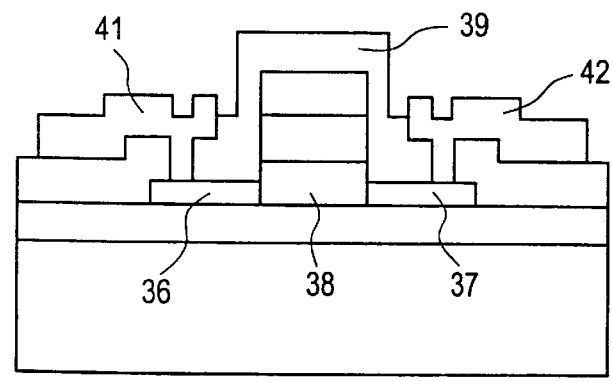

It is a valuable point of merit in manufacturing process terms that in the above process, because it is not the case that the silicon oxide film 34 only is to be selectively etched, the etching process does not need to be stopped accurately at the interface of the crystalline silicon film 33 and the silicon oxide film 34 and therefore the state shown in FIG. 2(E) can be obtained from the state shown in FIG. 2(D) device by RIE etching only. Also, because the silicon oxide film covering the source and drain regions is completely removed, the high energy ion doping operation that has conventionally been conducted through a silicon oxide film is unnecessary; as a result of this, little damage is caused by ion energy and high yields can be achieved. In the case of this preferred embodiment in particular, because it is possible to dope the exposed source and drain regions with an impurity which imparts a single conductivity type by direct laser doping, unlike conventional cases where ion doping is used no thermal annealing process is necessary after the doping, and yields can therefore be raised.

Furthermore, because no wet etching or other anisotropic etching is used in this process, there is no over-etching of the gate oxide film, and increases in the leak current flow toward the gate, reductions in the dielectric withstand voltage of the gate oxide film caused by reductions in the channel length, and adverse effects on circuit design caused by variations in the TFT characteristics can be minimized, and TFTs with high performance can be obtained with high yield.

After the state shown in FIG. 2(D) was obtained by etching, laser doping by excimer laser was carried out in order to reduce the resistance of the source region 36, the drain region 37 and the gate electrode 35.

The laser doping process will now be described: In this process a doping apparatus into which laser light can be irradiated through a quartz window, and having a vacuum chamber which is provided with a turbo-molecular pump and contains a substrate holder capable of being heated by a sheath heater, was used. First, the specimen was placed on the substrate holder and the chamber was evacuated by the turbo-molecular pump to a state of high vacuum, then the substrate temperature was brought to and held at 400 to 500 degrees centigrade and a gas mixture of phosphine and hydrogen was introduced into the chamber as the doping gas for N channel formation and the pressure held at 100 Pa. Under these conditions, by shining excimer laser light through the quartz window in the upper part of the chamber, phosphine molecules adsorbed by the substrate were decomposed and dispersed into the film to produce a layer of low electrical resistance. Here, the gate electrode layer was polycrystallized as the impurity was doped into it, and a gate electrode of low resistance polycrystalline silicon was formed.

As a doping action, doping by laser is highly anisotropic because the laser light itself is of non-scattering character. Therefore, the impurity is not doped into the exposed channel forming region side surfaces 40 between the source and drain regions and the channel region as long as the laser light irradiates the substrate perpendicularly.

In this preferred embodiment phosphine was used as the dopant, in order to form an NTFT; however, if hydrogen boride or boron fluoride is used as the dopant, PTFTs can also be made. Also, ion doping can be used as the doping method.

Referring to FIG. 2(E), after the above doping step, a silicon oxide film 39 was formed as an interlayer insulator film, to a thickness of 400 to 600 nm, by sputtering. The film forming conditions were the same as those used in forming the gate oxide film 34. Although in this process a silicon oxide film formed by sputtering was used, other known film forming methods such as plasma CVD, thermal CVD, optical CVD and liquid layer deposition may alternatively be used, and silicon nitride film can be used instead of silicon oxide film.

Next, contact holes were formed by photolithography and etching. This time wet etching, using HF:NH$_4$F=1:10 (by vol) buffer fluoric acid, was performed.

After the contact holes were formed, an aluminum film was formed to a thickness of 500 to 1000 nm in an electron beam vapor deposition apparatus to serve as lead-out electrodes 41 and 42. Then, electrode patterns were formed by photolithography and subsequently wet-etched with a commercially available aluminum etchant solution to remove the resist and complete the NTFT.

Although in this process aluminum was used for the lead-out electrodes 41 and 42, metals such as chromium, molybdenum and tantalum, and silicides, which are alloys with silicon, can alternatively be used. Also, the metal layer may alternatively be formed by sputtering and plating.

After completion of the TFT, the TFT substrate was put into a hydrogen atmosphere under atmospheric pressure, heated to 350 degrees centigrade, and hydrogen heat treated for 30 minutes in order to terminate defects at the channel interfaces and inside the active layers with hydrogen atoms and thereby stabilize the characteristics of the TFT.

FIG. 3 is a graph comparing the drain current—gate voltage performance of a TFT having a structure wherein the source and drain regions are of reduced thickness (a Thin Drain type TFT), made according to the above preferred embodiment, and a TFT which does not have such a structure (a Normal type TFT). The film thickness of the channel forming region of the TFT of this preferred embodiment was 150 nm and the film thickness of the source and drain regions was 50 nm. The channel forming region and the source and drain regions of the Normal type TFT comparison example were all of film thickness 150 nm.

As can be seen from FIG. 3, whereas the OFF current of the TFT of this preferred embodiment was very low, the OFF current of the Normal type TFT of conventional structure was greater than that of the TFT of this preferred embodiment by a magnitude of two digits. In their ON currents, on the other hand, there was no such difference between the TFT of this preferred embodiment and the conventional TFT, from which it can be concluded that no reduction in mutual conductance resulted from the adoption of the structure of this preferred embodiment and that rather, because of the reduction in the OFF current, the mutual conductance had increased. Also, there was almost no difference between the TFT of this preferred embodiment and the conventional TFT in terms of electric field mobility.

Furthermore, the source-drain withstand voltage with respect to the drain electric field was 30% better in the TFT of this preferred embodiment than in the conventional TFT.

Although in this preferred embodiment an amorphous silicon semiconductor crystallized by laser light was used, in this invention the type of semiconductor is not limited and semiconductors in other crystal states can also be used as necessary.

EMBODIMENT 2

Referring now to FIGS. 4(A) to 4(E), a method of forming an n-type insulated gate thin film field effect transistor in accordance with a second embodiment of the present invention will be explained.

A silicon oxide film 112 is deposited on a Corning 7059 glass substrate 111 by a plasma CVD technique to a thickness of 500 to 2500 angstroms in an atmosphere of tetra-ethoxysilane and oxygen. An amorphous silicon semiconductor film is deposited on the silicon oxide film 112 by a plasma CVD technique in the same manner to a thickness of 100 to 2000 angstroms e.g. 1500 angstroms to be source, channel and drain regions. The amorphous silicon semiconductor film is made of a substantially intrinsic semiconductor material. The silicon oxide 112 and the amorphous silicon semiconductor film are sequentially formed by means of a multi-chamber system comprising at least two vacuum chambers whose inside spaces are isolated from air.

Figure 4A:
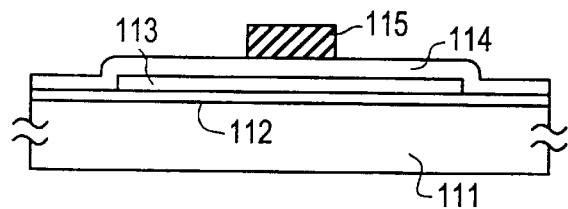
FIGS. 4(A) to 4(E) illustrate the manufacturing process of a TFT according to another preferred embodiment of the present invention.

The glass substrate 111 coated with the silicon oxide film 112 and the amorphous silicon semiconductor film is then dehydrogenized at 430 degrees centigrade for 30 to 60 minutes followed by thermal annealing at 600 degrees centigrade for 24 to 48 hours in order to crystallize the amorphous silicon semiconductor film. It is effective to carry out this crystallization by irradiating a laser light to the amorphous silicon film while heating the amorphous silicon film. For example, the amorphous silicon film is thermally annealed by irradiating a laser light having a wavelength of 308 nm while heating the substrate to 300 degrees centigrade. The atmosphere may be a vacuum for heat insulation. Nitrogen atmosphere under atmospheric pressure is also favorable. The irradiation of the laser light may be carried out after forming the silicon island region. It is effective to promote crystallization as follows. The amorphous silicon film is first crystallized by heating, and next patterned into an island, and thereafter the silicon island is irradiated with a laser light for the promotion of the crystallization. The amorphous silicon semiconductor film is then patterned to form a semiconductor region 113 in the form of an island. The upper surface of this structure is coated with a silicon oxide film 114 deposited by a plasma CVD technique to a thickness of 1000 angstroms. An aluminum film is also deposited by vacuum evaporation to a thickness of 5000 angstroms and patterned to form a gate electrode 115 as shown in Fig.4(A).

Figure 4B:
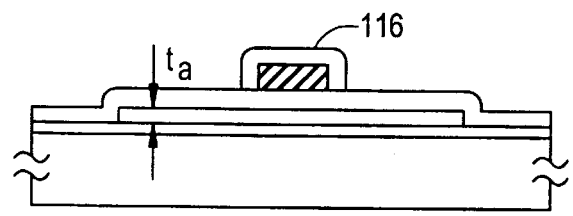

The substrate is placed in a 3% ethylene glycol solution of dihydroxysuccinic acid for anoding. A current is passed through the solution with the gate electrode 115 as an anode and a platinum as a cathode which is also placed in the solution to initiate anodic oxidation. The current is kept constant during the anodic oxidation while the voltage between the anode and the cathode is gradually increased to 220V. As a result, an anodic oxidation film 116 is formed around the gate electrode 115 as illustrated in Fig.4(B). The anodic oxidation film 116 and the gate electrode 115 are collectively called simply as the gate electrode 115 hereinbelow.

Figure 4C:
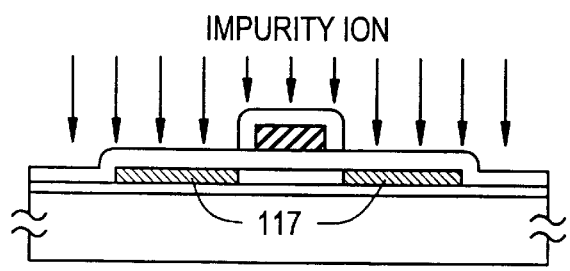

Next, an impurity element is introduced into the semiconductor region 113 by plasma doping with the gate electrode 115 as a mask. The impurity element is, for example, phosphorous to form source and drain regions 117 as illustrated in Fig.4(C). The conditions of the plasma doping are as follows.

Figure 4D:
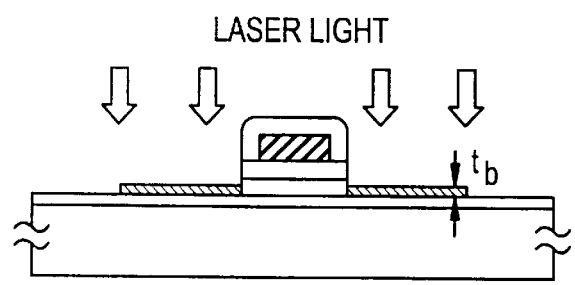

Dose Density: $1 \times 10^{14}$ to $5 \times 10^{15}$ cm$^{-2}$, e.g. $1 \times 10^{15}$ cm$^{-2}$ Acceleration Voltage: 30 to 120 KV, e.g. 80 kV RF plasma power: 5 to 50 W, e.g. 10 to 20 W Next, the gate insulating film 114 and a portion of the silicon island 113 are continuously removed by etching by RIE method to form a structure shown in Fig.4(D). The thickness $t_a$ of the silicon island 113 (as illustrated in Fig.4(B)) and the thickness $t_b$ of the remaining source and drain (as illustrated in FIG. 4(D)) satisfy the relation $0.3 < t_b/t_a < 0.9$, preferably the relation $0.5 < t_b/t_a < 0.8$.

The substrate is heated by means of a heater to a temperature no lower than 100 degrees centigrade, e.g. 300 degrees centigrade for example. The substrate temperature is preferably selected to be no higher than 450 degrees centigrade in order to avoid possible damage on the source and drain regions 117. The source and drain regions 117 is then exposed to laser rays from the upper side as illustrated in Fig.4(D). The laser rays are preferably generated by a KrF excimer laser. The conditions of this laser annealing are as follows.

Laser Energy Density: 200 mJ/cm$^2$

Shot repetition: 5 times

Substrate temperature: 300 degrees centigrade

Atmosphere: 100% nitrogen under atmospheric pressure

Since the source and drain regions 117 are exposed to the laser light, the impurity atoms contained therein sufficiently activated in spite of the low laser energy such as 200 mJ/cm$^2$. As a result, relatively high sheet resistances of the source and drain regions 117 can be realized typically as high as 300 to 500 ohms per square even though the dose density is only a fourth of a conventionally employed density.

Figure 4E:
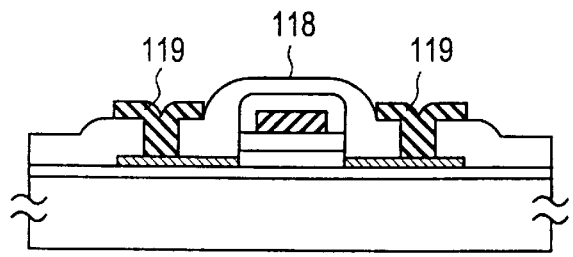

Next, a silicon oxide film 118 is deposited over the gate electrode 115 by a plasma CVD technique to a thickness of 2000 to 30000 angstroms e.g. 6000 angstroms. After opening contact holes, an aluminum film is deposited to contact with the source and drain regions 117 respectively through the contact holes and patterned to provide source and drain electrodes 119 as illustrated in Fig.4(E).

In accordance with experiments conducted by the inventors, the thin film transistors formed typically had carrier mobilities as high as 50 to 90 cm$^2$/Vs. Similar thin film transistors were formed in accordance with a conventional method for the purpose of estimating the improvement of reliability of the thin film transistor according to this embodiment of the present invention as compared to the conventional technique. The formation condition in accordance with the conventional technique were selected to equal to those of the above-explained embodiment except for the followings.

Dose Density: $4 \times 10^{15}$ cm$^{-2}$

Laser Energy Density: 250 mJ/cm$^2$

With the respective sources being grounded, 25V was applied for an hour between the respective drain and gate terminals of each of the thin film transistors according to the present invention and the conventional technique. As a result, the fluctuation of the threshold voltage and the reduction of the ON current after the voltage application was continued for an hour were limited to less than 0.1V and less than 10% in the case of the transistor in accordance with the present invention whereas the corresponding fluctuation and the reduction in the case of the conventional technique were measured to exceed 1.6V and 60% respectively. The improvement of reliability was then confirmed by the experiments.

As described above, according to this invention, by making the source and drain regions of a TFT thinner than the channel forming region, the portion constituting this thickness differential can be used to alleviate the electric field concentration phenomenon occurring at the interfaces of the source and drain regions and the channel portion, and a thin film transistor having low leakage, high mutual conductance and high withstand voltage can be obtained.

What is claimed is:

1. A transistor comprising:
   a semiconductor layer provided on a flat insulating surface and comprising a source region, a drain region, and a protrusion provided between said source region and said drain region, said protrusion comprising a channel;
   a gate electrode provided adjacent to said channel with a gate insulating layer therebetween; and
   at least one electrode connected to at least one of said source region and said drain region,
   wherein one of sides of said protrusion is substantially aligned with a junction between said drain region and said channel, and wherein said protrusion is provided adjacent to said gate electrode and has a side substantially vertical to said flat insulating surface.

2. The transistor of claim 1 wherein said both sides of said protrusion are substantially perpendicular to said flat insulating surface.

3. The transistor of claim 1 wherein said channel is located at a level different from those of locations of said source region and said drain region.

4. The transistor of claim 1 wherein said insulating surface is transparent.

5. The transistor of claim 1 wherein said gate electrode comprises a material selected from the group consisting of polysilicon, aluminum, chromium, molybdenum and tantalum.

6. The transistor of claim 1 wherein another of said sides of said protrusion is substantially aligned with a junction between said source region and said channel.

7. A transistor comprising:

a semiconductor layer provided on a flat insulating surface and comprising a source region, a drain region, and a protrusion provided between said source region and said drain region, said protrusion comprising a channel;

a gate electrode provided adjacent to said channel with a gate insulating layer therebetween; and at least one electrode connected to at least one of said source region and said drain region, wherein one of sides of said protrusion is substantially aligned with a junction between said drain region and said channel, and wherein said protrusion is provided adjacent to said gate electrode, and has a side substantially vertical to said flat insulating surface, and has a height of 200 to 2000 angstroms.

8. The transistor of claim 7 wherein said both sides of said protrusion are substantially perpendicular to said flat insulating surface.

9. The transistor of claim 7 wherein said channel is located at a level different from those of locations of said source region and said drain region.

10. The transistor of claim 7 wherein said insulating surface is transparent.

11. The transistor of claim 7 wherein said gate electrode comprises a material selected from the group consisting of polysilicon, aluminum, chromium, molybdenum and tantalum.

12. The transistor of claim 7 wherein another of said sides of said protrusion is substantially aligned with a junction between said source region and said channel.

13. A transistor comprising:

a semiconductor layer provided on a flat insulating surface and comprising a source region, a drain region, and a protrusion provided between said source region and said drain region, said protrusion comprising a channel;

a gate electrode provided adjacent to said channel with a gate insulating layer therebetween;

an oxide of a material of said gate electrode provided at least on a side of said gate electrode; and at least one electrode connected to at least one of said source region and said drain region, wherein one of sides of said protrusion is substantially aligned with a junction between said drain region and said channel, and wherein said protrusion is provided adjacent to said gate electrode and has a side substantially vertical to said flat insulating surface.

14. The transistor of claim 13 wherein said both sides of said protrusion are substantially perpendicular to said flat insulating surface.

15. The transistor of claim 13 wherein said channel is located at a level different from those of locations of said source region and said drain region.

16. The transistor of claim 13 wherein said insulating surface is transparent.

17. The transistor of claim 13 wherein said gate electrode comprises a material selected from the group consisting of polysilicon, aluminum, chromium, molybdenum and tantalum.

18. The transistor of claim 13 wherein another of said sides of said protrusion is substantially aligned with a junction between said source region and said channel.

19. A transistor comprising:

a semiconductor layer provided on a flat insulating surface and comprising a source region, a drain region, and a protrusion provided between said source region and said drain region, said protrusion comprising a channel; and a gate electrode provided adjacent to said channel with a gate insulating layer therebetween, wherein one of sides of said protrusion is substantially aligned with a junction between said drain region and said channel, wherein said protrusion is provided adjacent to said gate electrode, and has a side substantially vertical to said flat insulating surface, and wherein thickness $t_a$ of said semiconductor layer in said protrusion and thickness $t_b$ of said semiconductor layer in said source region and said drain region satisfy $0.3<t_b/t_a<0.9$.

20. The transistor of claim 19 wherein said both sides of said protrusion are substantially perpendicular to said flat insulating surface.

21. The transistor of claim 19 wherein said channel is located at a level different from those of locations of said source region and said drain region.

22. The transistor of claim 19 wherein said insulating surface is transparent.

23. The transistor of claim 19 wherein said gate electrode comprises a material selected from the group consisting of polysilicon, aluminum, chromium, molybdenum and tantalum.

24. The transistor of claim 19 wherein another of said sides of said protrusion is substantially aligned with a junction between said source region and said channel.

* * * * *